US012483252B2

(12) United States Patent
Zhu

(10) Patent No.: US 12,483,252 B2
(45) Date of Patent: Nov. 25, 2025

(54) CLOCK SYNCHRONIZATION SYSTEM AND METHOD

(71) Applicant: SANECHIPS TECHNOLOGY CO., LTD, Shenzhen (CN)

(72) Inventor: Licheng Zhu, Shenzhen (CN)

(73) Assignee: SANECHIPS TECHNOLOGY CO., LTD, Shenzhen (CN)

( * ) Notice: Subject to any disclaimer, the term of this patent is extended or adjusted under 35 U.S.C. 154(b) by 71 days.

(21) Appl. No.: 18/709,161

(22) PCT Filed: Mar. 19, 2022

(86) PCT No.: PCT/CN2022/081855
§ 371 (c)(1),
(2) Date: May 10, 2024

(87) PCT Pub. No.: WO2023/082518
PCT Pub. Date: May 19, 2023

(65) Prior Publication Data
US 2025/0007525 A1 Jan. 2, 2025

(30) Foreign Application Priority Data
Nov. 15, 2021 (CN) .......................... 202111350980.4

(51) Int. Cl.
H03L 7/091 (2006.01)
H03L 7/081 (2006.01)
H03L 7/099 (2006.01)

(52) U.S. Cl.
CPC .......... *H03L 7/0992* (2013.01); *H03L 7/0818* (2013.01); *H03L 7/091* (2013.01)

(58) Field of Classification Search
CPC ...... H03L 7/0992; H03L 7/0818; H03L 7/091
(Continued)

(56) References Cited

U.S. PATENT DOCUMENTS

2012/0319749 A1 12/2012 Thaller et al.
2020/0256893 A1* 8/2020 Knierim .................... H03L 7/08

FOREIGN PATENT DOCUMENTS

CN 1798378 A 7/2006
CN 106357270 A 1/2017
(Continued)

OTHER PUBLICATIONS

Extended European Search Report for Application No. 22891330.7, dated Feb. 3, 2025, 11 pages.
(Continued)

*Primary Examiner* — Dominic D Saltarelli
(74) *Attorney, Agent, or Firm* — CANTOR COLBURN LLP

(57) ABSTRACT

A clock synchronization system and method are provided. The clock synchronization system includes: a pulse generation module, configured to receive an input first signal, perform sampling processing of the first signal to obtain a second signal, and generate a pulse signal according to the second signal; a voltage-controlled oscillator, configured to output a first output clock; the output frequency divider module, configured to perform frequency division on the first output clock, and synchronize, according to the pulse signal, the first output clock which has been subjected to the frequency division, so as to obtain a second output clock; and the synchronous output module, configured to receive the first output clock, the second output clock, the first signal, and the pulse signal, and perform synchronization processing on the first signal according to the first output clock, the second output clock and the pulse signal, so as to obtain a third signal.

20 Claims, 5 Drawing Sheets

(58) Field of Classification Search
USPC .......................................................... 375/376
See application file for complete search history.

(56) References Cited

FOREIGN PATENT DOCUMENTS

| CN | 111490867 A | 8/2020 |
| CN | 112636748 A | 4/2021 |
| EP | 0371324 A1 | 6/1990 |
| WO | 2017101484 A1 | 6/2017 |

OTHER PUBLICATIONS

International Search Report for corresponding application PCT/CN2022/081855 filed Mar. 19, 2022; Mail date Aug. 19, 2022.

* cited by examiner

Fig. 1

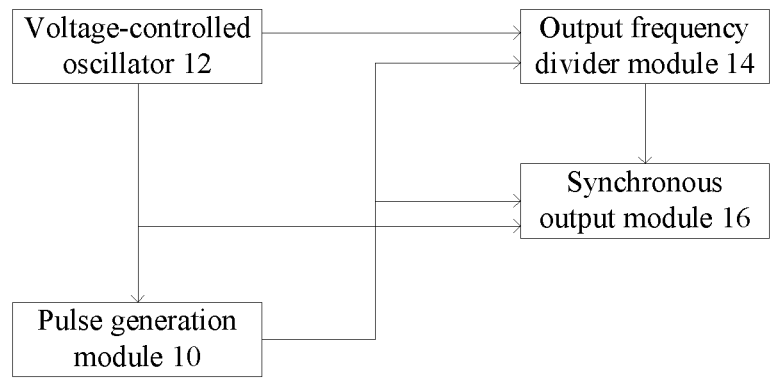

Fig. 2

| Input a first signal and a first output clock into the pulse generation module, so that the pulse generation module samples the first signal to obtain a second signal, and generates a pulse signal according to the second signal and the first output clock | S202 |

| Input the pulse signal and the first output clock into the output frequency divider module, so that the output frequency divider module performs frequency division on the first output clock, and synchronizes, according to the pulse signal, the first output clock which has been subjected to the frequency division, so as to obtain a second output clock | S204 |

| Input the pulse signal, the first output clock, the second output clock and the first signal into the synchronous output module, so that the synchronous output module performs synchronization processing on the first signal according to the first output clock, the second output clock and the pulse signal, so as to obtain a third signal, wherein the third signal and the second output clock are synchronous signals | S206 |

CLOCK SYNCHRONIZATION SYSTEM AND METHOD

CROSS-REFERENCE TO RELATED APPLICATION

The present disclosure is a National Stage Filing of the PCT International Application No. PCT/CN2022/081855 filed on Mar. 19, 2022, which claims the priority to Chinese Patent Application 202111350980.4, filed with the China Patent Office on Nov. 15, 2021, and entitled "Clock Synchronization System and Method", the entire contents of which are herein incorporated by reference.

TECHNICAL FIELD

The present disclosure mainly relates to the field of communications, and in particular to a clock synchronization system and method.

BACKGROUND

Digital-to-analog/analog-to-digital converter technologies are increasingly mature, and the sampling rates of analog-to-digital converters and digital-to-analog converters of semiconductor companies are several orders of magnitude faster than those of products before decades. For example, in 2005, the sampling rate of a 12-bit resolution digital-to-analog/analog-to-digital converter with the highest speed in the world is 250 MS/s; while by 2018, the sampling rate of the 12-bit analog/analog-to-digital converter has reached 6.4 GS/s. Due to the improvement of the performance in these aspects, the digital-to-analog/analog-to-digital converters may directly digitize Radio-Frequency (RF) signals, and provide a sufficient dynamic range for modern communication and radar systems.

With the emergence of ultra-high speed digital-to-analog/analog-to-digital converters with higher resolutions, radio-frequency input signals may be directly converted into signals of thousands of megabits Hz. These conversion rates enable engineers to perform digitization at very high instant bandwidths at an L-band and an S-band. With the continuous development of the digital-to-analog/analog-to-digital converters, direct radio-frequency sampling at other frequency bands (such as a C-band and an X-band) starts to come true.

The main advantages of direct radio-frequency sampling lie in that a radio-frequency signal chain is simplified, so that the cost and density of each channel are reduced. A device based on a direct radio-frequency sampling architecture is generally smaller in appearance and size and higher in power efficiency due to fewer analog components used. If a system with a large number of channels is constructed, the area occupancy and cost of the system may be reduced by using the direct radio-frequency sampling. In addition to reducing size, weight, and power, a simplified architecture can also eliminate potential sources of noise, imaging, and other errors within the RF device, such as Local Oscillator (LO) leakage and quadrature imbalance. Finally, the direct radio-frequency sampling architecture can also simplify synchronization. For example, to achieve the phase consistency of a radio-frequency system, an internal clock and a local oscillator of a radio-frequency device need to be synchronized. In direct sampling that does not require the local oscillator, it is only necessary to pay attention to the clock synchronization of the device.

In a chip of a wireless communication system of the current radio-frequency direct sampling transceiver, delay and jitter deviations are relatively large, and the maximum deviation reaches a level of 10 ns. The main reason for such a large deviation includes an interface delay deviation and a cross-clock-domain deviation. However, a digital link has a plurality of cross-clock-domain designs therein in order to take multiple factors such as design reliability and power consumption into consideration, which contradicts with reducing the delay and jitter.

With the improvement in market positioning requirements, the communication system has higher requirements for positioning delay precision, thus promoting an improvement in the delay accuracy performance of a hardware system. In order to meet the system requirements, it is required that the delay deviation between multiple times of power-on of the system chip is less than 1 ns. In order to achieve system-level clock precision below 1 ns, the clock precision specifically achieved at a clock phase-locked loop part needs to be approximately controlled within a high-frequency clock period, for example, at a 16 GHz sampling clock frequency, the delay needs to be less than 62.5 ps. However, in related art, the delay deviation between multiple times of power-on of the system chip is far greater than 62.5 ps.

In view of the problem in the related art that the delay deviation between multiple times of power-on of the system chip is relatively large, no effective technical solution has been proposed.

SUMMARY

Embodiments of the present disclosure provide a clock synchronization system and method, which may at least solve the problem in related art that the delay deviation between multiple times of power-on of a system chip is relatively large.

The embodiments of the present disclosure provide a clock synchronization system, including: a pulse generation module, a synchronous output module connected with the pulse generation module, an output frequency divider module connected with the pulse generation module and the synchronous output module, and a voltage-controlled oscillator connected with the pulse generation module, the output frequency divider module and the synchronous output module, wherein the voltage-controlled oscillator is configured to output a first output clock to the output frequency divider module, the pulse generation module and the synchronous output module; the pulse generation module is configured to receive a first signal from an external input and the first output clock output by the voltage-controlled oscillator, sample the first signal to obtain a second signal, generate a pulse signal according to the second signal and the first output clock, and output the pulse signal to the output frequency divider module and the synchronous output module respectively; the output frequency divider module is configured to receive the pulse signal output by the pulse generation module and the first output clock output by the voltage-controlled oscillator, perform frequency division on the first output clock, and synchronize, according to the pulse signal, the first output clock which has been subjected to the frequency division; and the synchronous output module is connected with an output end of the pulse generation module and an output end of the output frequency divider module, and is configured to receive the first output clock output by the voltage-controlled oscillator, a second output clock output by the output frequency divider module, the first signal from the external input and the pulse signal output by the pulse generation module, and perform synchronization processing on the first signal according to the first output clock, the second output clock and the pulse signal, so as to obtain a third signal, wherein the third signal and the second output clock are synchronous signals and are respectively output to a digital-to-analog conversion module.

The embodiments of the present disclosure also provide a clock synchronization method, including: inputting a first signal and a first output clock into the pulse generation module, so that the pulse generation module samples the first signal to obtain a second signal, and generates a pulse signal according to the second signal and the first output clock; inputting the pulse signal and the first output clock into the output frequency divider module, so that the output frequency divider module performs frequency division on the first output clock, and synchronizes, according to the pulse signal, the first output clock which has been subjected to the frequency division; and inputting the pulse signal, the first output clock, a second output clock and the first signal into the synchronous output module, so that the synchronous output module performs synchronization processing on the first signal according to the first output clock, the second output clock and the pulse signal, so as to obtain a third signal, wherein the third signal and the second output clock are synchronous signals.

The embodiments of the present disclosure also provide a computer-readable storage medium, in which a computer program is stored, wherein the computer program is configured to execute the operations in any one of the foregoing method embodiments when running.

The embodiments of the present disclosure also provide an electronic device, including a memory and a processor, wherein a computer program is stored in the memory, and the processor is configured to run the computer program, so as to execute the operations in any one of the foregoing method embodiments.

By means of the above technical solutions, the voltage-controlled oscillator outputs the first output clock to the output frequency divider module, the pulse generation module and the synchronous output module; the pulse generation module receives the first signal from the external input and the first output clock output by the voltage-controlled oscillator, samples the first signal to obtain the second signal, generates the pulse signal according to the second signal, and respectively outputs the pulse signal to the output frequency divider module and the synchronous output module; the output frequency divider module receives the pulse signal output by the pulse generation module and the first output clock output by the voltage-controlled oscillator, performs frequency division on the first output clock, and synchronizes, according to the pulse signal, the first output clock which has been subjected to the frequency division; and the synchronous output module receives the first output clock output by the voltage-controlled oscillator, the second output clock output by the output frequency divider module, the first signal from the external input and the pulse signal output by the pulse generation module, and performs synchronization processing on the first signal according to the first output clock, the second output clock and the pulse signal, so as to obtain the third signal, wherein the third signal and the second output clock are synchronous signals and are respectively output to the digital-to-analog conversion module. By using the above technical solutions, the problem in related art that the delay deviation between multiple times of power-on of a system chip is relatively large is solved. In the embodiments of the present disclosure, an output clock of an output frequency divider is synchronized based on a first signal from an external input which is subjected to internal processing of a phase-locked loop, the first signal is sampled by the synchronized second output clock and is output to other subsystems in a link such as an analog-to-digital converter/digital-to-analog converter, so that the other subsystems implement the same synchronization operation as the phase-locked loop, and a precise delay function is achieved for the entire chip.

BRIEF DESCRIPTION OF THE DRAWINGS

The drawings described herein are used to provide a further understanding of the present disclosure and constitute a part of the present disclosure, and exemplary embodiments of the present disclosure and descriptions thereof are used to explain the present disclosure, and do not constitute an improper limitation on the present disclosure. In the drawings:

FIG. 1 is a system block diagram of a clock synchronization system according to the embodiments of the present disclosure;

FIG. 2 is a flowchart of a clock synchronization method according to an exemplary embodiment of the present disclosure;

DETAILED DESCRIPTION

Figure 3:
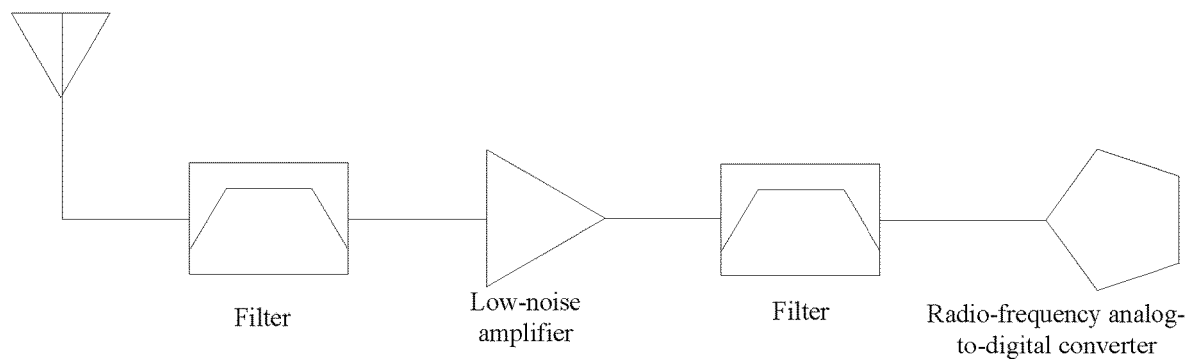
FIG. 3 is a receiving block diagram of a radio-frequency direct sampling system according to an exemplary embodiment of the present disclosure.

The present disclosure will be described in detail hereinafter with reference to the drawings and in combination with the embodiments. It should be noted that, in the case of no conflict, the embodiments in the present disclosure and features in the embodiments may be combined with each other.

It should be noted that, the terms "first" and "second" and the like in the specification, claims and the above drawings of the present disclosure are used for distinguishing similar objects, and are not necessarily used for describing a specific sequence or precedence order. It should be understood that the data used in this way may be interchanged under appropriate circumstances, so as to describe the embodiments of the present disclosure described herein. In addition, the terms "including/comprising" and "having", and any variations thereof are intended to cover non-exclusive inclusions, for example, processes, methods, systems, products or devices including a series of operations or units are not necessarily limited to those clearly listed operations or units, but may include other operations or units that are not clearly listed or are inherent to these processes, methods, products or devices.

Unless otherwise defined, all technical and scientific terms used herein have the same meanings as commonly understood by those having ordinary skill in the art. The terms used herein in the specification of the present disclosure are for the purpose of describing exemplary embodiments only and are not intended to limit the present disclosure.

The present embodiment provides a clock synchronization system. FIG. 1 is a system block diagram of a clock synchronization system according to the embodiments of the present disclosure. As shown in FIG. 1, the clock synchronization system includes:

a pulse generation module 10, a synchronous output module 16 connected with the pulse generation module 10, an output frequency divider module 14 connected with the pulse generation module 10 and the synchronous output module 16, and a voltage-controlled oscillator 12 connected with the pulse generation module 10, the output frequency divider module 16 and the synchronous output module 14.

The voltage-controlled oscillator 12 is configured to output a first output clock (sometimes referred to as first output signal) to the output frequency divider module 14, the pulse generation module 10 and the synchronous output module 16.

The pulse generation module 10 is configured to receive a first signal from an external input and the first output clock output by the voltage-controlled oscillator 12, sample the first signal to obtain a second signal, generate a pulse signal according to the second signal and the first output clock, and respectively output the pulse signal to the output frequency divider module 14 and the synchronous output module 16.

The output frequency divider module 14 is configured to receive the pulse signal output by the pulse generation module 10 and the first output clock output by the voltage-controlled oscillator 12, perform frequency division on the first output clock, and synchronize, according to the pulse signal, the first output clock which has been subjected to the frequency division.

The synchronous output module 16 is configured to receive the first output clock output by the voltage-controlled oscillator 12, a second output clock output by the output frequency divider module 14, the first signal from the external input and the pulse signal output by the pulse generation module 10, and perform synchronization processing on the first signal according to the first output clock, the second output clock and the pulse signal, so as to obtain a third signal, wherein the third signal and the second output clock are synchronous signals and are respectively output to a digital-to-analog conversion module.

By means of the above operations, the voltage-controlled oscillator 12 outputs the first output clock to the output frequency divider module 14, the pulse generation module 10 and the synchronous output module 16; the pulse generation module 10 receives the input first signal and the first output clock output by the voltage-controlled oscillator 12, samples the first signal to obtain the second signal, generates the pulse signal according to the second signal and the first output clock, and respectively outputs the pulse signal to the output frequency divider module 14 and the synchronous output module 16; the output frequency divider module 14 receives the pulse signal output by the pulse generation module 10 and the first output clock output by the voltage-controlled oscillator 12, performs frequency division on the first output clock, and synchronizes, according to the pulse signal, the first output clock which has been subjected to the frequency division; and the synchronous output module 16 receives the first output clock output by the voltage-controlled oscillator 12, the second output clock output by the output frequency divider module 14, the first signal from the external input and the pulse signal output by the pulse generation module 10, and performs synchronization processing on the first signal according to the first output clock, the second output clock and the pulse signal, so as to obtain the third signal, wherein the third signal and the second output clock are synchronous signals and are respectively output to the digital-to-analog conversion module. By using the above technical solutions, the problem in related art that the delay deviation between multiple times of power-on of a system chip is relatively large is solved. In the embodiments of the present disclosure, an output clock of an output frequency divider is synchronized based on a first signal from an external input which is subjected to internal processing of a phase-locked loop, the first signal is sampled by the synchronized second output clock and is output to other subsystems in a link such as an analog-to-digital converter/digital-to-analog converter, so that the other subsystems implement the same synchronization operation as the phase-locked loop, and a precise delay function is achieved for the entire chip.

In an exemplary embodiment, the pulse generation module 10 in the clock synchronization system is configured to generate a pulse signal with a controllable pulse width according to the first signal from the external input, wherein the first signal may be a reference signal or 10 ms periodic signal, and the pulse signal is used for synchronizing the first output clock of the output frequency divider (i.e., the above output frequency divider module) with the third signal output by the output sampling circuit. In an exemplary embodiment, the pulse generation module includes:

a delay module, configured to sample the first signal to obtain the second signal;

a first sampling circuit module, connected with an output end of the delay module, and configured to receive the second signal output by the delay module, and perform rising-edge sampling on the second signal, so as to obtain a fourth signal;

a first high-frequency sampling circuit module, connected with an output end of the first sampling circuit module, and configured to receive the fourth signal output by the first sampling circuit module, and sample the fourth signal according to the first output clock, so as to obtain a fifth signal; and an exclusive OR circuit module, connected with an output end of the first high-frequency sampling circuit module, and configured to receive the fifth signal output by the first high-frequency sampling circuit module, and perform an exclusive OR operation on the fifth signal, so as to obtain the pulse signal.

In the embodiment of the present disclosure, the delay module is used to solve the problem that the first signal is asynchronous with the output clock of the voltage-controlled oscillator to lead to a metastable state, and the first signal is sampled to obtain the corresponding second signal; the first sampling circuit module is designed to eliminate a falling edge of the second signal, so that the pulse generation module only identifies a rising edge signal in the entire synchronization function process; a sampling clock in the first high-frequency sampling circuit module is the first output clock output by the voltage-controlled oscillator, and beating is performed on the fourth signal, which has been subjected to the rising-edge sampling, according to the first output clock so as to obtain the fifth signal with a fixed phase difference; and the exclusive OR circuit module implements an exclusive OR function to perform exclusive OR on the fifth signal, so as to generate the pulse signal with a certain width.

In an exemplary embodiment, the first high-frequency sampling circuit module includes: a second high-frequency sampling circuit module, configured to sample the fourth signal according to the first output clock, so as to obtain a sixth signal; a third high-frequency sampling circuit module, connected with an output end of the second high-frequency sampling circuit module, and configured to receive the sixth signal output by the second high-frequency sampling circuit module, and sample the sixth signal according to the first output clock, so as to obtain a seventh signal; a fourth high-frequency sampling circuit module, connected with an output end of the third high-frequency sampling circuit module, and configured to receive the seventh signal output by the third high-frequency sampling circuit module, and sample the seventh signal according to the first output clock, so as to obtain an eighth signal; and a fifth high-frequency sampling circuit module, connected with an output end of the fourth high-frequency sampling circuit module, and configured to receive the eighth signal output by the fourth high-frequency sampling circuit module, and sample the eighth signal according to the first output clock, so as to obtain a ninth signal, wherein the fifth signal includes: the sixth signal, the seventh signal, the eighth signal and the ninth signal.

That is, the first high-frequency sampling circuit module consists of the second high-frequency sampling circuit module, the third high-frequency sampling circuit module, the fourth high-frequency sampling circuit module and the fifth high-frequency sampling circuit module. The second high-frequency sampling circuit module, the third high-frequency sampling circuit module, the fourth high-frequency sampling circuit module and the fifth high-frequency sampling circuit module respectively sample the fourth signal according to the first output clock (which may also be understood as beating the fourth signal according to the first output clock), so as to obtain the sixth signal, the seventh signal, the eighth signal and the ninth signal. The sixth signal and the ninth signal are input into the exclusive OR circuit module. It should be noted that, the functions of the second high-frequency sampling circuit module, the third high-frequency sampling circuit module, the fourth high-frequency sampling circuit module and the fifth high-frequency sampling circuit module are optional, and may implement the adjustable pulse width of the pulse signal.

In an exemplary embodiment, the exclusive OR circuit module is connected with the output end of the second high-frequency sampling circuit module and the output end of the fifth high-frequency sampling circuit module, and is further configured to receive the sixth signal output by the second high-frequency sampling circuit module and the ninth signal output by the fifth high-frequency sampling circuit module, and perform the exclusive OR operation on the sixth signal and the ninth signal, so as to obtain the pulse signal.

That is, the exclusive OR circuit module performs the exclusive OR operation on the sixth signal and the ninth signal, which are output by the first beat and an optional number of subsequent beats, so as to generate the pulse signal with the fixed width, and the width of the pulse signal is an integer multiple period of an output frequency corresponding to the first output signal (first output clock).

The basic function of the output frequency divider is to perform frequency division of a specified frequency division ratio on the first output signal (first output clock) output by the voltage-controlled oscillator, so as to generate a second output signal which has been subjected to frequency division. It should be noted that, the output frequency divider also achieves a synchronization function, that is, the synchronization function proposed in the embodiments of the present disclosure directly acts on the output frequency divider module. In the embodiment of the present disclosure, the specific structure of the output frequency divider module is illustrated. The output frequency divider module includes: an AND gate module, configured to receive the pulse signal output by the pulse generation module and an enable control signal of the output frequency divider module, and perform an AND operation on the enable control signal and the pulse signal, so as to obtain a reset signal of a frequency divider module; and the frequency divider module, connected with an output end of the AND gate module, and configured to receive the reset signal output by the AND gate module, and determine the second output clock according to the reset signal and the first output clock.

Specifically, the basic function implemented by the AND gate module is to perform the AND operation on the enable control signal of the output frequency divider and the pulse signal. Taking a synchronization requirement into consideration, the first output clock output by the voltage-controlled oscillator needs to be used for beating in the actual circuit design, so as to ensure that the output reset signal is synchronous with the first output signal of the output frequency divider. It should be noted that, when the entire system does not need synchronization or there is no first signal, the output frequency divider can still output a normal output signal. The frequency divider module may be composed of a plurality of frequency divider modules, so as to meet different frequency division requirements, but due to the requirement of the synchronization function, a frequency divider here needs to have a fixed initial working state when being powered on. When the reset signal is "1", the frequency divider module works normally; when the reset signal is "0", the frequency divider module outputs a certain fixed level. When the reset signal is switched from "0" to "1", the change state of the frequency divider module from no-working to normal-working is fixed each time.

In an exemplary embodiment, the synchronous output module includes: a rising-edge sampling module, configured to perform rising-edge sampling on the first signal, so as to obtain a tenth signal; a falling-edge sampling module, configured to perform falling-edge sampling on the first signal, so as to obtain an eleventh signal; a sixth high-frequency sampling circuit module, connected with an output end of the rising-edge sampling module and an output end of the falling-edge sampling module, and configured to receive the tenth signal output by the rising-edge sampling module or the eleventh signal output by the falling-edge sampling module, and sample the tenth signal or the eleventh signal according to the first output clock, so as to obtain a twelfth signal; and a first low-frequency sampling module, connected with an output end of the sixth high-frequency sampling circuit module and an output end of the pulse generation module, and configured to receive the twelfth signal output by the sixth high-frequency sampling circuit module and the pulse signal output by the pulse generation module, and sample the twelfth signal according to the second output clock and the pulse signal, so as to obtain the fourth signal.

It should be noted that, the function of the synchronous output module is to sample the first signal by using the second output clock, and output the first signal to a digital-to-analog/analog-to-digital converter and the like in a radio-frequency direct sampling system. The synchronous output module mainly includes the following functional parts: 1) the rising-edge/falling-edge sampling module: sampling the first signal in a rising edge or falling edge manner, so as to reduce an uncertain delay of synchronization to a half period instead of one period of the second output clock; 2) the high-frequency sampling module: a clock used by the high-frequency sampling module is the first output clock, after a sampling delay caused by the previous rising-edge/falling-edge sampling module is deducted, the number of beats herein should be completely the same as the number of beats of the pulse signal, and the same high-frequency clock source is used to ensure the synchronization of the first signal and the pulse signal (which can also be understood as that the first signal and the pulse signal have a fixed phase difference); and 3) the low-frequency sampling module: re-synchronizing the twelfth signal by using a second output signal. The low-frequency sampling module ensures that the delay herein is the same as the delay of the output frequency divider, so as to shorten the uncertain delay. Finally, the first output clock of the output frequency divider is sent, together with the fourth signal synchronized by the first output clock, to the next stage of the radio-frequency direct sampling system.

In an exemplary embodiment, the first low-frequency sampling module includes: a second low-frequency sampling module, configured to sample the twelfth signal according to the second output clock and the pulse signal, so as to obtain a thirteenth signal; and a third low-frequency sampling module, connected with an output end of the second low-frequency sampling module, and configured to receive the thirteenth signal output by the second low-frequency sampling module, and sample the thirteenth signal according to the second output clock, so as to obtain the fourth signal.

The present embodiment provides a clock synchronization method. FIG. 2 is a flowchart of the clock synchronization method according to the embodiments of the present disclosure. The clock synchronization method is applied to the above clock synchronization system, and the clock synchronization method includes the following operations S202 to S206.

In operation S202, a first signal and a first output clock are input into the pulse generation module, so that the pulse generation module samples the first signal to obtain a second signal, and generates a pulse signal according to the second signal and the first output clock.

In operation S204, the pulse signal and the first output clock are input into the output frequency divider module, so that the output frequency divider module performs frequency division on the first output clock, and synchronizes, according to the pulse signal, the first output clock which has been subjected to the frequency division.

In operation S206, the pulse signal, the first output clock, a second output clock and the first signal are input into the synchronous output module, so that the synchronous output module performs synchronization processing on the first signal according to the first output clock, the second output clock and the pulse signal to obtain a third signal, wherein the third signal and the second output clock are synchronous signals.

In the above embodiment, the first signal and the first output clock are input into the pulse generation module, so that the pulse generation module samples the first signal to obtain the second signal, and generates the pulse signal according to the second signal and the first output clock; the pulse signal and the first output clock are input into the output frequency divider module, so that the output frequency divider module performs frequency division on the first output clock, and synchronizes, according to the pulse signal, the first output clock which has been subjected to the frequency division; and the pulse signal, the first output clock, the second output clock and the first signal are input into the synchronous output module, so that the synchronous output module performs synchronization processing on the first signal according to the first output clock, the second output clock and the pulse signal, so as to obtain the third signal, wherein the third signal and the second output clock are synchronous signals. By using the above technical solutions, the problem in related art that the delay deviation between multiple times of power-on of a system chip is relatively large is solved. In the embodiments of the present disclosure, an output clock of an output frequency divider is synchronized based on a first signal from an external input which is subjected to internal processing of a phase-locked loop, the first signal is sampled by the synchronized second output clock and is output to other subsystems in a link such as an analog-to-digital converter/digital-to-analog converter, so that the other subsystems implement the same synchronization operation as the phase-locked loop, and a precise delay function is achieved for the entire chip.

Further, the pulse signal may be generated according to the second signal in the following manner. The first signal is input into the delay module, so that the delay module samples the first signal to obtain the second signal. The second signal is input into the first sampling circuit module, so that the first sampling circuit module performs rising-edge sampling on the second signal to obtain a fourth signal. The fourth signal is input into the first high-frequency sampling circuit module, so that the first high-frequency sampling circuit module samples the fourth signal according to the first output clock to obtain a fifth signal. The fifth signal is input into the exclusive OR circuit module, so that the exclusive OR circuit module performs an exclusive OR operation on the fifth signal to obtain the pulse signal.

In some exemplary embodiments, the fifth signal may be input into the exclusive OR circuit module in the following manner. The first output clock is input into the second high-frequency sampling circuit module, so that the second high-frequency sampling circuit module samples the fourth signal according to the first output clock to obtain a sixth signal. The sixth signal is input into the third high-frequency sampling circuit module, so that the third high-frequency sampling circuit module samples the sixth signal according to the first output clock to obtain a seventh signal. The seventh signal is input into the fourth high-frequency sampling circuit module, so that the fourth high-frequency sampling circuit module samples the seventh signal according to the first output clock to obtain an eighth signal. The eighth signal is input into the fifth high-frequency sampling circuit module, so that the fifth high-frequency sampling circuit module samples the eighth signal according to the first output clock to obtain a ninth signal. The sixth signal and the ninth signal are input into the exclusive OR circuit module, wherein the fifth signal includes the sixth signal, the seventh signal, the eighth signal and the ninth signal, and the first high-frequency sampling circuit module includes the second high-frequency sampling circuit module, the third high-frequency sampling circuit module, the fourth high-frequency sampling circuit module, and the fifth high-frequency sampling circuit module.

In order to better understand the working process and principle of the clock synchronization system, a process of parallel decoding is explained in combination with several exemplary embodiments, the technical solutions of the embodiments of the present disclosure are not limited thereto.

Embodiment 1

The present disclosure provides a clock synchronization system applicable to the radio-frequency direct sampling technology. FIG. 3 is a receiving block diagram of a radio-frequency direct sampling system according to an exemplary embodiment of the present disclosure. As shown in FIG. 3, the clock synchronization system in the embodiment of the present disclosure may solve the problem of an excessively large delay in the system clock. In the embodiments of the present disclosure, a first output clock (which is equivalent to the first output signal in the above embodiments) of an output frequency divider is synchronized based on a reference signal or 10 ms periodic signal from an external input (which is equivalent to the first signal in the above embodiment) which is subjected to internal processing of a phase-locked loop circuit, the reference signal or 10 ms periodic signal is sampled by a synchronized second output clock, and the synchronized reference signal or 10 ms periodic signal is output to other subsystems in a link such as an analog-to-digital converter/digital-to-analog converter, so that the other subsystems implement the same synchronization operation as a phase-locked loop, and a precise delay function is achieved for the entire chip.

The clock synchronization system in the embodiment of the present disclosure is proposed to adapt to low-delay requirements of a 5G communication system, thereby solving the problem of excessively large clock delays in super-heterodyne and zero Intermediate Frequency (IF) transceiving systems, greatly improving the performance of the 5G communication system, and improving the user experience.

Figure 4:
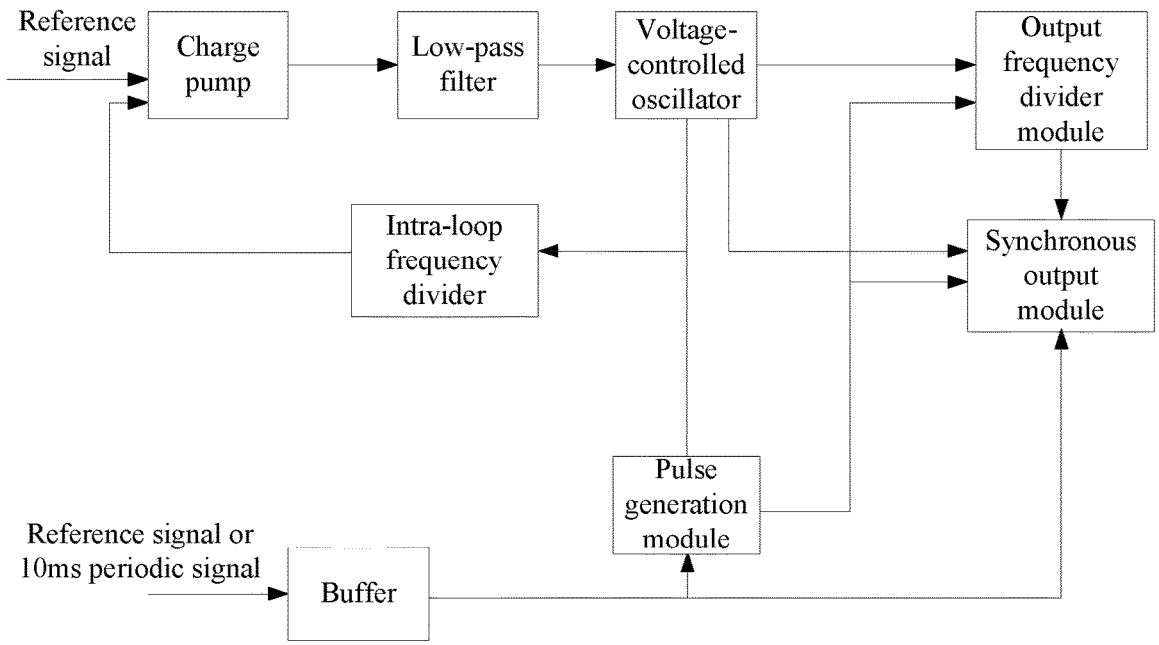
FIG. 4 is a circuit architecture of a phase-locked loop, which is applied to a radio-frequency direct sampling system and has a clock synchronization function, according to an exemplary embodiment of the present disclosure.
Figure 5:
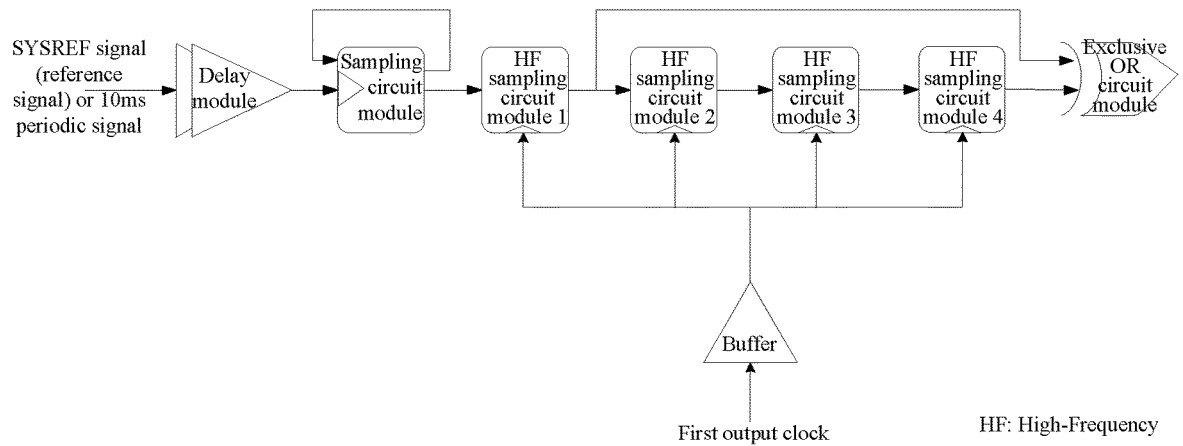
FIG. 5 is a block diagram of a pulse generation module according to an exemplary embodiment of the present disclosure.

As shown in FIG. 4, FIG. 4 is a circuit architecture of the phase-locked loop, which is applied to a radio-frequency direct sampling system and has a clock synchronization function, according to an exemplary embodiment of the present disclosure. The clock synchronization system in the embodiment of the present disclosure specifically includes the following modules:

1. A pulse generation module, which generates a pulse signal with a controllable pulse width according to a reference signal or 10 ms periodic signal from an external input, wherein the pulse signal is used for synchronizing a first output clock of an output frequency divider with a first signal of an output sampling module. As shown in FIG. 5, FIG. 5 is a block diagram of the pulse generation module according to an exemplary embodiment of the present disclosure, and the pulse generation module includes the following functional parts:

1) A delay module: the delay unit is designed to have an adjustable delay, so as to solve the problem that the reference signal or 10 ms periodic signal may be asynchronous with a first output clock output by a voltage-controlled oscillator, leading to a metastable state.

2) A sampling circuit module (which is equivalent to a first sampling circuit in the above embodiment): the sampling circuit module is designed to eliminate a falling edge of the reference signal or 10 ms periodic signal, so that the pulse generation module only identifies a rising edge signal in the entire synchronization function process.

3) A high-frequency sampling circuit module (which is equivalent to the first high-frequency sampling circuit module in the above embodiment) (high-frequency sampling circuit modules 1-4) (which are equivalent to the second high-frequency sampling circuit module, the third high-frequency sampling circuit module, the fourth high-frequency sampling circuit module and the fifth high-frequency sampling circuit module in the above embodiment): a sampling clock of the high-frequency sampling circuit module is the first output clock output by the voltage-controlled oscillator, and by means of performing logic control on the sampled reference signal or 10 ms periodic signal, the functions of the high-frequency sampling circuit modules 1-4 are optional, so as to implement the adjustable pulse width of the pulse signal.

4) An exclusive OR circuit module: the exclusive OR circuit module implements an exclusive OR function, and performs exclusive OR on the synchronized reference signal or 10 ms periodic signal (which is equivalent to the fifth signal in the above embodiment), so as to generate the pulse signal with a certain width.

Figure 7:
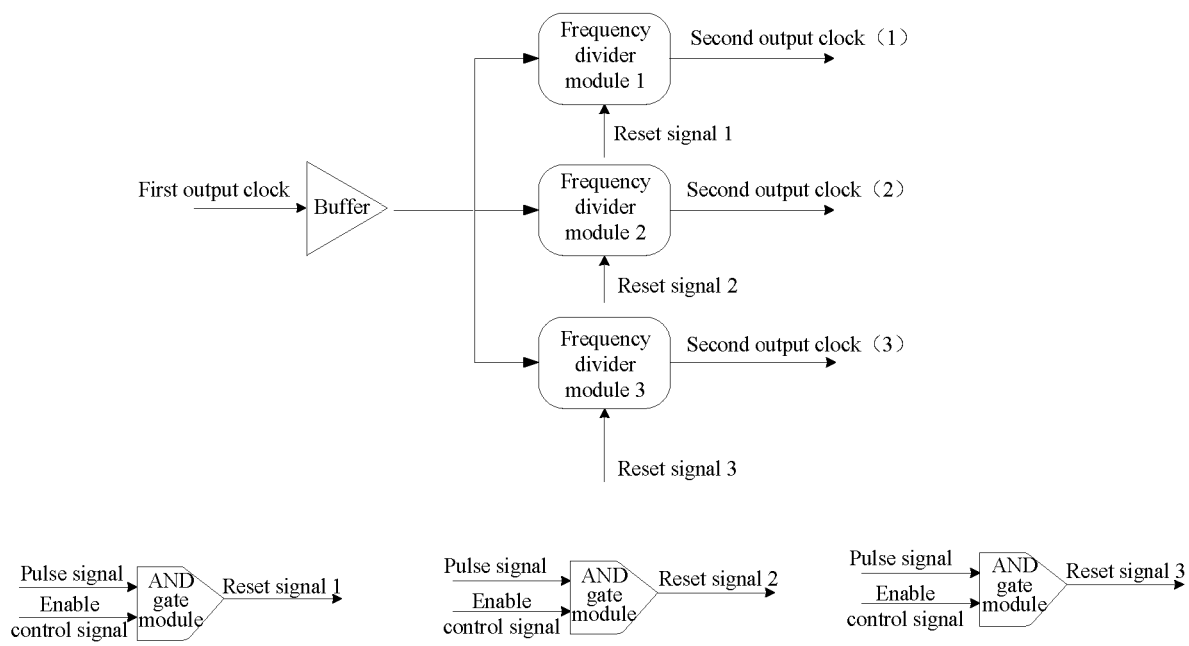
FIG. 7 is a block diagram of an output frequency divider module according to an exemplary embodiment of the present disclosure.

2. An output frequency divider: the basic function of the output frequency divider is to perform frequency division of a specified frequency division ratio on the first output signal of the voltage-controlled oscillator, so as to generate a second output clock, which has been subjected to frequency division. Here, the output frequency divider also takes a synchronization function into consideration, that is, the synchronization function proposed in the embodiments of the present disclosure directly acts on the output frequency divider. As shown in FIG. 7, FIG. 7 is a block diagram of the output frequency divider module according to an exemplary embodiment of the present disclosure, and the output frequency divider module mainly includes the following functional parts:

1) A frequency divider module (frequency divider modules 1-3): the frequency divider module implements a basic function of frequency division, but due to the requirement of the synchronization function, a frequency divider here needs to have a fixed initial working state when being powered on. When a reset signal is "1", the frequency divider module works normally; when the reset signal is "0", the frequency divider module outputs a certain fixed level; and when the reset signal is switched from "0" to "1", the change state of the frequency divider module from no-working to normal-working is determined each time. It should be noted that the frequency divider modules 1-3 are configured to achieve different frequency division ratios, and the corresponding frequency divider modules are selected according to the required frequency division ratios in use.

2) An AND gate module: the basic function implemented by this module is to perform an AND operation on an enable control signal of the output frequency divider and the pulse signal, but a synchronization requirement is taken into consideration, therefore in the actual circuit design, the first output clock needs to be used for beating, so as to ensure that the output reset signal is synchronous with the first output clock itself. Moreover, this module is designed to ensure that the output of a normal clock of the output frequency divider is not affected when the entire system does not require synchronization or no reference signal or 10 ms periodic signal is input.

Figure 6:
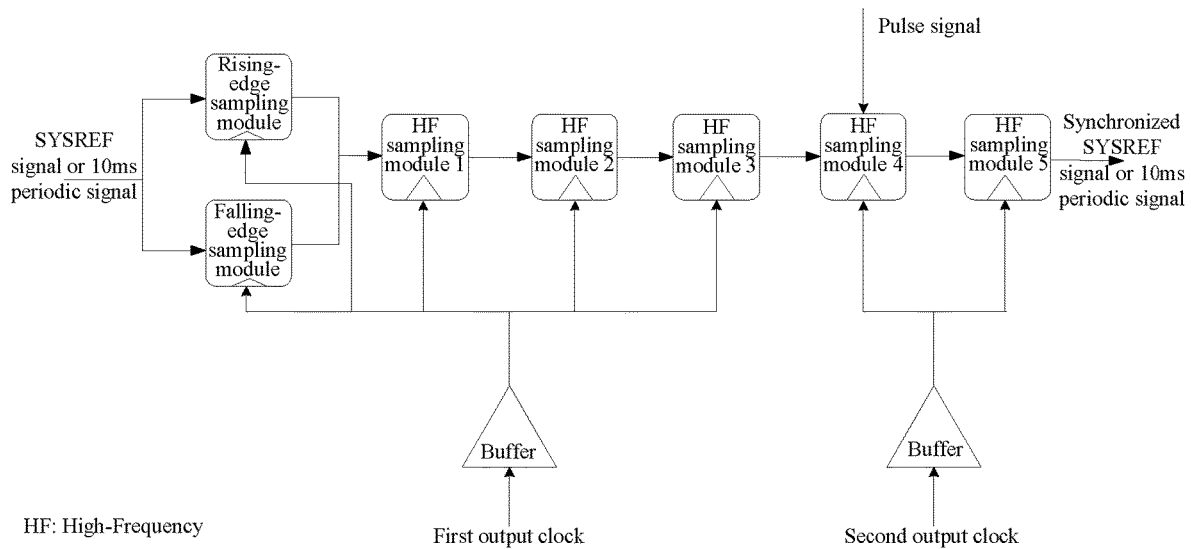
FIG. 6 is a block diagram of a synchronous output module according to an exemplary embodiment of the present disclosure.

3. A synchronous output module: the function of this module is to sample the reference signal by using the output clock of the synchronized output frequency divider, and output the reference signal to the digital-to-analog/analog-to-digital converter and the like in the radio-frequency direct sampling system. As shown in FIG. 6, FIG. 6 is a block diagram of the synchronous output module according to an exemplary embodiment of the present disclosure, and the synchronous output module mainly includes the following functional parts:

1) a rising-edge/falling-edge sampling module, which samples the reference signal or 10 ms periodic signal in a rising edge or falling edge manner, so as to mainly shorten an uncertain delay of synchronization to a half period instead of one period of the first output clock.

2) A high-frequency sampling module (which is equivalent to the sixth high-frequency sampling circuit module in the above embodiment) (high-frequency sampling modules 1-3): a clock used by the sampling module herein is the first output signal, a sampling delay caused by sampling the reference signal or 10 ms periodic signal in the rising-edge/falling-edge manner is eliminated, the beating frequency herein should be completely the same as the beating frequency of the pulse signal, and the same high-frequency clock source is used to ensure the synchronization of the reference signal or 10 ms periodic signal and the pulse signal.

3) A low-frequency sampling module (which is equivalent to the first low-frequency sampling module in the above embodiment) (low-frequency sampling modules 4-5) (which are equivalent to the second low-frequency sampling module and the third low-frequency sampling module in the above embodiment): the two low-frequency sampling module herein function to re-synchronize the synchronized reference signal or 10 ms periodic signal by using the second output clock. The low-frequency sampling module 4 further controls the sampling enable of the pulse signal to ensure that the delay herein is the same as the delay of the output frequency divider, so as to shorten the uncertain delay. Finally, the synchronous output clock of the output frequency divider is sent, together with the reference signal or 10 ms periodic signal synchronized by the synchronous output clock, to the next stage of the radio-frequency direct sampling system.

Embodiment 2

The exemplary implementation of the clock synchronization system of the present disclosure is described in detail in combination with the following embodiments, and the specific operations are as follows.

In operation 1, a reference signal or 10 ms periodic signal from an external input is sampled and synchronized. The reference signal or 10 ms periodic signal from the external input is divided by an internal buffer drive into two paths for processing, one path of the reference signal or 10 ms periodic signal is used for generating a pulse signal by means of a pulse generation module, and the other path of the reference signal or 10 ms periodic signal is processed by a synchronous communication_DFF module, which has the same number of beats as the pulse generation module, as shown in FIG. 5 and FIG. 7, so that a synchronized reference signal or 10 ms periodic signal is output.

In operation 2, the pulse generation module generates a pulse signal. As shown in FIG. 5, certain sampling processing is firstly performed on the input reference signal or 10 ms periodic signal, so as to eliminate a metastable state between the reference signal and a first output clock output by a voltage-controlled oscillator, and the maximum delay of the delay module is controlled within one output clock period. Then, the a falling edge introduced by the reference signal or 10 ms periodic signal is eliminated, so that only a rising edge is kept, beating is performed on the rising edge signal, and exclusive OR is performed on the outputs of the first beat and an optional number of subsequent beats, so as to generate the pulse signal with a fixed width, wherein the width of the pulse signal is an integer multiple period of the output frequency of the first output clock.

In operation 3, the pulse signal is processed in a frequency divider module. The pulse signal is transmitted to an OUP-TUTDIV module, a control signal of an output frequency divider is generated by means of certain logic control and high-frequency clock beating, the normal work and enable turn-off of the output frequency divider are controlled, and the output frequency divider is turned off at a certain fixed level and cannot have uncertainty.

Specifically, after the pulse signal is output to the frequency divider module, as shown in FIG. 7, AND logic is performed on the pulse signal and the enable control signal of the frequency divider module, so as to ensure that the control signal is limited by the pulse signal and the enable control signal at the same time. However, before being subjected to the logic operation, a control capable of pulling up the pulse signal to a high level needs to be performed on the pulse signal, so as to ensure that when the pulse signal fails, the enable control of the entire frequency divider is not affected, and that normal frequency division may be performed. Moreover, in order to ensure that the enable signal of the frequency divider is a synchronous signal, beating needs to be performed on the enable signal, and thus a reset signal is generated.

In operation 4, the pulse signal is processed in a synchronous output module. The pulse signal is output to the synchronous output module for resetting a low-frequency sampling circuit (as shown in FIG. 6). When the pulse signal is at a low level, the low-frequency sampling module 4 remains not working, so as to prevent the reference signal from being sampled by an output clock before the reference signal is synchronized by the output frequency divider. In order to ensure that the output clock, which has been synchronized by the output frequency divider, may absolutely sample the reference signal, two output sampling circuits, that is, the low-frequency sampling modules 4 and the low-frequency sampling module 5, are designed (as shown in FIG. 6).

In operation 5, enable control of the frequency divider module is performed based on the reset signal. After the reset signal acts on the frequency divider module, a synchronized second output clock may be output. With regard to the design of a core frequency divider in the output frequency divider, on one hand, it is necessary to ensure a correct frequency division function at a high frequency; and more importantly, with regard to the embodiment of the present disclosure, when the enable function of the frequency divider is turned off, it is ensured that the level of each node is determined and is a high or low level, and that there is no uncertain level, so as to prevent the occurrence of an uncertain initial state when the frequency divider is enabled next time.

In operation 6, the output frequency divider outputs a synchronous clock to sample the synchronized reference signal. The synchronized output clock of the output frequency divider is used as the sampling clock of the low-frequency sampling module 4 and the low-frequency sampling module 5 in FIG. 6, and the reference signal is output to a digital-to-analog/analog-to-digital converter after being sampled.

So far, the entire clock synchronization function is completed.

Embodiment 3

The implementation of an entire precise delay function in the phase-locked loop is illustrated by taking it as an example that the output frequency divider works in a mode of frequency division by two.

Figure 8:
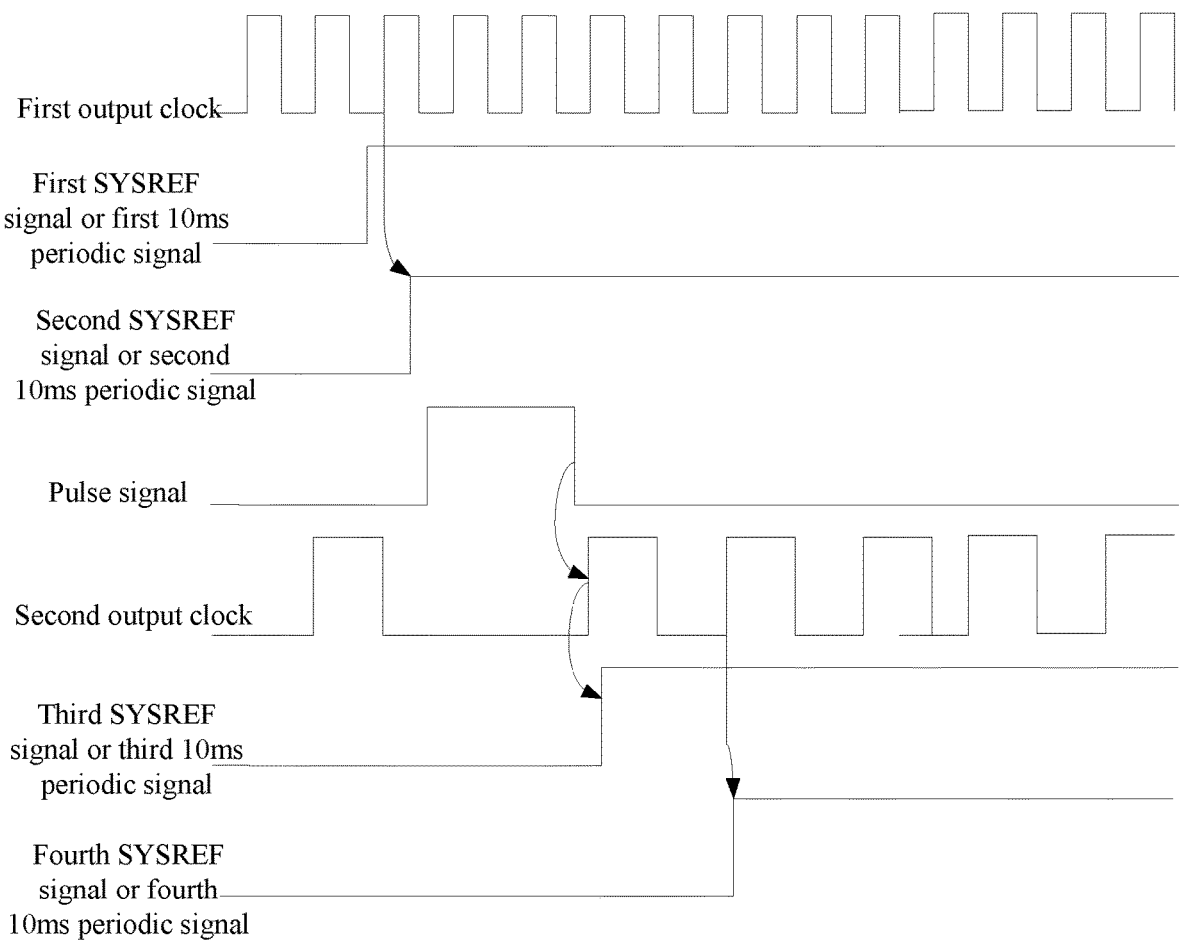
FIG. 8 is an action time-sequence diagram of a synchronization function according to an exemplary embodiment of the present disclosure.

As shown in FIG. 8, the first output clock output by the voltage-controlled oscillator is used as a reference clock of the entire synchronization function. When a first reference signal or first 10 ms periodic signal is input, the first output clock performs asynchronous sampling on the first reference signal or first 10 ms periodic signal, and performs sampling at the next rising edge to obtain a synchronized second reference signal or second 10 ms periodic signal (which is equivalent to the second signal in the above embodiment). A synchronized pulse signal is generated by using the second reference signal or second 10 ms periodic signal. By means of the pulse width of the pulse signal, a reset signal is generated for the output frequency divider, so as to turn off the output of the output frequency divider, and when the reset signal is released, all the output frequency dividers start to work at fixed levels at the same moment, these initial working states are all fixed and do not change along with the structures or clock frequencies of the frequency dividers, and the turn-off times of the frequency dividers are only controlled by the pulse width of the pulse signal.

After the reset signal of the frequency divider is released, an output frequency division clock is turned on at a fixed level and starts at a deterministic time, that is, it can be considered that the output frequency division clock has a fixed phase relationship with the second reference signal or second 10 ms periodic signal, and the first output clock is synchronized by the second reference signal or second 10 ms periodic signal to obtain a second output clock.

As can be seen from FIG. 8, the second reference signal or second 10 ms periodic signal is sampled according to the second output clock, so as to obtain a third reference signal or third 10 ms periodic signal and a fourth reference signal or fourth 10 ms periodic signal, the fourth reference signal or fourth 10 ms periodic signal establishes a stable synchronization relationship with the second output clock, the fourth reference signal or fourth 10 ms periodic signal and the second output clock are output, in pairs, to a next-stage subsystem such as the digital-to-analog/analog-to-digital converter. In the digital-to-analog/analog-to-digital converter and other subsystems, the same synchronization function is achieved, in this way, a first-level clock is synchronized to an accurate delay by the reference signal or 10 ms periodic signal, that is, the precise delay function of the entire radio-frequency direct sampling system may be realized.

It should be noted that, in the embodiments of the present disclosure, the generation mode of the pulse signal of the pulse generation module is implemented by high-frequency clock beating, so that a pulse with a fixed and controllable width is obtained, and the pulse signal and the clock are synchronous. The purpose of generating a frequency divider control signal may also be achieved by means of performing exclusive OR on different delays of the reference signal or 10 ms periodic signal, however, the delay of the pulse signal itself generated in this manner is uncertain, and the uncertain delay is prolonged when a process angle, high and low temperatures and power supply voltage conditions change. In the embodiments of the present disclosure, enable control is performed on the application of the low-frequency sampling module 4 in FIG. 6 by using the pulse signal, so as to actually achieve the effect of preventing a clock, which is not synchronized, from sampling the reference signal, this effect may also be achieved by using a large number of delay units, but if a delay exceeding one voltage-controlled oscillator period is achieved by using the large number of delay units, the uncertain delay of the reference signal may be introduced, and this condition is even worse under a power supply voltage.

The above descriptions are only preferred embodiments of the present disclosure, and are not intended to limit the present disclosure, and for those skilled in the art, the present disclosure may have various changes and modifications. Any modifications, equivalent replacements, improvements and the like, made within the principles of the present disclosure, shall fall within the protection scope of the present disclosure.

What is claimed is:

1. A clock synchronization system, comprising:
   a pulse generation module,
   a synchronous output module connected with the pulse generation module,
   an output frequency divider module connected with the pulse generation module and the synchronous output module, and
   a voltage-controlled oscillator connected with the pulse generation module, the output frequency divider module and the synchronous output module,
   wherein
   the voltage-controlled oscillator is configured to output a first output clock to the output frequency divider module, the pulse generation module and the synchronous output module;
   the pulse generation module is configured to receive a first signal from an external input and the first output clock output by the voltage-controlled oscillator, sample the first signal to obtain a second signal, generate a pulse signal according to the second signal and the first output clock, and output the pulse signal to the output frequency divider module and the synchronous output module respectively;
   the output frequency divider module is configured to receive the pulse signal output by the pulse generation module and the first output clock output by the voltage-controlled oscillator, perform frequency division on the first output clock, and synchronize, according to the pulse signal, the first output clock which has been subjected to the frequency division, so as to obtain a second output clock; and
   the synchronous output module is configured to receive the first output clock output by the voltage-controlled oscillator, the second output clock output by the output frequency divider module, the first signal from the external input and the pulse signal output by the pulse generation module, and perform synchronization processing on the first signal according to the first output clock, the second output clock and the pulse signal, so as to obtain a third signal, wherein the third signal and the second output clock are synchronous signals and are respectively output to a digital-to-analog conversion module.

2. The clock synchronization system according to claim 1, wherein the pulse generation module comprises:
a delay module, configured to sample the first signal to obtain the second signal;
a first sampling circuit module, connected with an output end of the delay module, and configured to receive the second signal output by the delay module, and perform rising-edge sampling on the second signal, so as to obtain a fourth signal;
a first high-frequency sampling circuit module, connected with an output end of the first sampling circuit module, and configured to receive the fourth signal output by the first sampling circuit module, and sample the fourth signal according to the first output clock, so as to obtain a fifth signal; and
an exclusive OR circuit module, connected with an output end of the first high-frequency sampling circuit module, and configured to receive the fifth signal output by the first high-frequency sampling circuit module, and perform an exclusive OR operation on the fifth signal, so as to obtain the pulse signal.

3. The clock synchronization system according to claim 2, wherein the first high-frequency sampling circuit module comprises:
a second high-frequency sampling circuit module, configured to sample the fourth signal according to the first output clock, so as to obtain a sixth signal;
a third high-frequency sampling circuit module, connected with an output end of the second high-frequency sampling circuit module, and configured to receive the sixth signal output by the second high-frequency sampling circuit module, and sample the sixth signal according to the first output clock, so as to obtain a seventh signal;
a fourth high-frequency sampling circuit module, connected with an output end of the third high-frequency sampling circuit module, and configured to receive the seventh signal output by the third high-frequency sampling circuit module, and sample the seventh signal according to the first output clock, so as to obtain an eighth signal; and
a fifth high-frequency sampling circuit module, connected with an output end of the fourth high-frequency sampling circuit module, and configured to receive the eighth signal output by the fourth high-frequency sampling circuit module, and sample the eighth signal according to the first output clock, so as to obtain a ninth signal, wherein the fifth signal comprises: the sixth signal, the seventh signal, the eighth signal and the ninth signal.

4. The clock synchronization system according to claim 3, wherein the exclusive OR circuit module is connected with the output end of the second high-frequency sampling circuit module and the output end of the fifth high-frequency sampling circuit module, and is further configured to receive the sixth signal output by the second high-frequency sampling circuit module and the ninth signal output by the fifth high-frequency sampling circuit module, and perform the exclusive OR operation on the sixth signal and the ninth signal, so as to obtain the pulse signal.

5. The clock synchronization system according to claim 2, wherein the delay module is designed to have an adjustable delay, so as to enable the first signal to be synchronous with the first output clock output by the voltage-controlled oscillator.

6. The clock synchronization system according to claim 2, wherein the first sampling circuit module is configured to eliminate a falling edge of the first signal.

7. The clock synchronization system according to claim 1, wherein the output frequency divider module comprises:
an AND gate module, configured to receive the pulse signal output by the pulse generation module and an enable control signal of the output frequency divider module, and perform an AND operation on the enable control signal and the pulse signal, so as to obtain a reset signal of a frequency divider module; and
the frequency divider module, connected with an output end of the AND gate module, and configured to receive the reset signal output by the AND gate module, and determine the second output clock according to the reset signal and the first output clock.

8. The clock synchronization system according to claim 7, wherein the frequency divider module works normally when the reset signal is equal to a first value, and the frequency divider module outputs a fixed level when the reset signal is equal to a second value.

9. The clock synchronization system according to claim 1, wherein the synchronous output module comprises:
a rising-edge sampling module, configured to perform rising-edge sampling on the first signal, so as to obtain a tenth signal;
a falling-edge sampling module, configured to perform falling-edge sampling on the first signal, so as to obtain an eleventh signal;
a sixth high-frequency sampling circuit module, connected with an output end of the rising-edge sampling module and an output end of the falling-edge sampling module, and configured to receive the tenth signal output by the rising-edge sampling module or the eleventh signal output by the falling-edge sampling module, and sample the tenth signal or the eleventh signal according to the first output clock, so as to obtain a twelfth signal; and
a first low-frequency sampling module, connected with an output end of the sixth high-frequency sampling circuit module and an output end of the pulse generation module, and configured to receive the twelfth signal output by the sixth high-frequency sampling circuit module and the pulse signal output by the pulse generation module, and sample the twelfth signal according to the second output clock and the pulse signal, so as to obtain the fourth signal.

10. The clock synchronization system according to claim 9, wherein the first low-frequency sampling module comprises:
a second low-frequency sampling module, configured to sample the twelfth signal according to the second output clock and the pulse signal, so as to obtain a thirteenth signal; and
a third low-frequency sampling module, connected with an output end of the second low-frequency sampling module, and configured to receive the thirteenth signal output by the second low-frequency sampling module, and sample the thirteenth signal according to the second output clock, so as to obtain the fourth signal.

11. A clock synchronization method for the clock synchronization system according to claim 1, the clock synchronization method comprising:
inputting a first signal and a first output clock into the pulse generation module, so that the pulse generation module samples the first signal to obtain a second signal, and generates a pulse signal according to the second signal and the first output clock;
inputting the pulse signal and the first output clock into the output frequency divider module, so that the output frequency divider module performs frequency division on the first output clock, and synchronizes, according to the pulse signal, the first output clock which has been subjected to the frequency division, so as to obtain a second output clock; and
inputting the pulse signal, the first output clock, the second output clock and the first signal into the synchronous output module, so that the synchronous output module performs synchronization processing on the first signal according to the first output clock, the second output clock and the pulse signal, so as to obtain a third signal, wherein the third signal and the second output clock are synchronous signals.

12. The clock synchronization method according to claim 11, wherein inputting the first signal into the pulse generation module, so that the pulse generation module samples the first signal to obtain the second signal, and generates the pulse signal according to the second signal comprises:
inputting the first signal into a delay module, so that the delay module samples the first signal to obtain the second signal;
inputting the second signal into a first sampling circuit module, so that the first sampling circuit module performs rising-edge sampling on the second signal to obtain a fourth signal;
inputting the fourth signal into a first high-frequency sampling circuit module, so that the first high-frequency sampling circuit module samples the fourth signal according to the first output clock to obtain a fifth signal; and
inputting the fifth signal into an exclusive OR circuit module, so that the exclusive OR circuit module performs an exclusive OR operation on the fifth signal to obtain the pulse signal.

13. The clock synchronization method according to claim 12, wherein inputting the fifth signal into the exclusive OR circuit module comprises:
inputting the first output clock into a second high-frequency sampling circuit module, so that the second high-frequency sampling circuit module samples the fourth signal according to the first output clock to obtain a sixth signal;
inputting the sixth signal into a third high-frequency sampling circuit module, so that the third high-frequency sampling circuit module samples the sixth signal according to the first output clock to obtain a seventh signal;
inputting the seventh signal into a fourth high-frequency sampling circuit module, so that the fourth high-frequency sampling circuit module samples the seventh signal according to the first output clock to obtain an eighth signal;
inputting the eighth signal into a fifth high-frequency sampling circuit module, so that the fifth high-frequency sampling circuit module samples the eighth signal according to the first output clock to obtain a ninth signal; and
inputting the sixth signal and the ninth signal into the exclusive OR circuit module, wherein the fifth signal comprises the sixth signal, the seventh signal, the eighth signal and the ninth signal, and the first high-frequency sampling circuit module comprises the second high-frequency sampling circuit module, the third high-frequency sampling circuit module, the fourth high-frequency sampling circuit module, and the fifth high-frequency sampling circuit module.

14. The clock synchronization method according to claim 13, wherein the exclusive OR circuit module is connected with the output end of the second high-frequency sampling circuit module and the output end of the fifth high-frequency sampling circuit module, and the exclusive OR circuit module receives the sixth signal output by the second high-frequency sampling circuit module and the ninth signal output by the fifth high-frequency sampling circuit module, and performs the exclusive OR operation on the sixth signal and the ninth signal, so as to obtain the pulse signal.

15. The clock synchronization method according to claim 11, wherein the output frequency divider module uses an AND gate module to perform an AND operation on the enable control signal and the pulse signal, so as to obtain a reset signal of a frequency divider module; and uses a frequency divider module determine the second output clock according to the reset signal and the first output clock.

16. The clock synchronization method according to claim 11, wherein the synchronous output module uses a rising-edge sampling module to perform rising-edge sampling on the first signal, so as to obtain a tenth signal; uses a falling-edge sampling module to perform falling-edge sampling on the first signal, so as to obtain an eleventh signal; uses a sixth high-frequency sampling circuit module to sample the tenth signal or the eleventh signal according to the first output clock, so as to obtain a twelfth signal; and uses a first low-frequency sampling module to sample the twelfth signal according to the second output clock and the pulse signal, so as to obtain the fourth signal.

17. The clock synchronization method according to claim 16, wherein the first low-frequency sampling module uses a second low-frequency sampling module to sample the twelfth signal according to the second output clock and the pulse signal, so as to obtain a thirteenth signal; and uses a third low-frequency sampling module to sample the thirteenth signal according to the second output clock, so as to obtain the fourth signal.

18. The clock synchronization system according to claim 1, wherein the pulse generation module in the clock synchronization system is configured to generate the pulse signal with a controllable pulse width according to the first signal from the external input.

19. The clock synchronization system according to claim 18, wherein the first signal is a reference signal or periodic signal, and the pulse signal is used for synchronizing the first output clock of the output frequency divider module with the third signal.

20. The clock synchronization system according to claim 18, wherein the pulse width of the pulse signal is an integer multiple period of an output frequency corresponding to the first output clock.

* * * * *